(12) United States Patent
Birli et al.

(10) Patent No.: US 9,397,491 B2
(45) Date of Patent: Jul. 19, 2016

(54) ELECTRICAL BOX MOUNTING BRACKET WITH RAILS

(71) Applicant: ERICO International Corporation, Solon, OH (US)

(72) Inventors: Mary Ellen Birli, Twinsburg, OH (US); Ronald Adam Jones, Cleveland, OH (US); Raymond Scott Laughlin, Middlefield, OH (US); Raymond Michael Olle, Broadview Heights, OH (US)

(73) Assignee: ERICO INTERNATIONAL CORPORATION, Solon, OH (US)

( * ) Notice: Subject to any disclaimer, the term of this patent is extended or adjusted under 35 U.S.C. 154(b) by 0 days.

(21) Appl. No.: 13/651,542

(22) Filed: Oct. 15, 2012

(65) Prior Publication Data

US 2014/0103180 A1   Apr. 17, 2014

(51) Int. Cl.
*H02G 3/08*   (2006.01)
*H02G 3/12*   (2006.01)

(52) U.S. Cl.
CPC . *H02G 3/12* (2013.01); *H02G 3/125* (2013.01)

(58) Field of Classification Search
USPC ............... 248/906, 200, 56, 57, 300, 68.1; 174/50, 58; 220/3.2, 3.3, 3.7, 3.9, 3.92, 220/3.94; 439/532
See application file for complete search history.

(56) References Cited

U.S. PATENT DOCUMENTS

| 740,663 | A |   | 10/1903 | Krantz |
|---|---|---|---|---|
| 1,211,182 | A | * | 1/1917 | Kruse ........................ 248/218.4 |
| 1,786,004 | A | * | 12/1930 | Clayton ...................... 248/228.5 |
| 1,790,031 | A | * | 1/1931 | Vaughn ........................... 220/3.9 |
| 1,898,282 | A | * | 2/1933 | Almcrantz ...................... 220/3.8 |
| 2,023,083 | A | * | 12/1935 | Knell .............................. 220/3.9 |
| 2,378,861 | A |   | 6/1945 | Peevey |
| 2,707,221 | A |   | 4/1955 | Frank |
| 2,881,924 | A | * | 4/1959 | Kruse et al. ..................... 211/26 |
| 2,989,206 | A |   | 6/1961 | McAfee |
| 3,365,156 | A | * | 1/1968 | Beck .......................... 248/205.1 |
| 3,424,332 | A |   | 1/1969 | Pimentel |
| 3,424,333 | A |   | 1/1969 | Pimentel |

(Continued)

OTHER PUBLICATIONS

"TSRBS1625 Telescoping Box Mount for single and multiple gang boxes", Instruction Sheet, 2009, ERICO International Corporation, 3 pgs.

(Continued)

*Primary Examiner* — Terrell McKinnon
*Assistant Examiner* — Michael McDuffie
(74) *Attorney, Agent, or Firm* — Quarles & Brady LLP

(57) ABSTRACT

An electrical installation bracket includes a body that may telescope to allow the length of the bracket to be changed to accommodate installation in different configurations, for example to accommodate different spacing between mounting studs. The bracket has rails on a face that allow an electrical box to be positioned, by sliding, at any of a variety of locations along the length of the body. The body has holes in it for securing the box to the bracket at a desired location along the body, with a front of the box for example protruding through an opening in the body. The body includes ears on opposite sides of the opening, with mounting holes for mounting the bracket to studs or other structure (or other hardware or devices). The electrical installation bracket advantageously provides more flexibility in placement of electrical boxes, with pre-prepared holes available for securing boxes.

22 Claims, 9 Drawing Sheets

(56) References Cited

U.S. PATENT DOCUMENTS

| | | | | |
|---|---|---|---|---|
| 3,575,313 | A | 4/1971 | Trachtenberg et al. | |
| 3,676,571 | A | 7/1972 | Rubinstein | |
| 3,952,475 | A | 4/1976 | Paskert | |
| 4,019,647 | A | 4/1977 | Arnold | |
| 4,165,443 | A | 8/1979 | Figart et al. | |
| 4,612,412 | A | 9/1986 | Johnston | |
| 4,634,015 | A | 1/1987 | Taylor | |
| 4,757,967 | A * | 7/1988 | Delmore | E04B 2/7453 248/218.4 |
| 4,842,551 | A | 6/1989 | Heimann | |
| 5,012,043 | A | 4/1991 | Seymour | |
| 5,025,944 | A | 6/1991 | Rodick | |
| 5,042,673 | A | 8/1991 | McShane | |
| 5,098,046 | A | 3/1992 | Webb | |
| 5,114,105 | A * | 5/1992 | Young | 248/27.1 |
| 5,293,003 | A | 3/1994 | Prairie, Jr. | |
| RE35,075 | E | 10/1995 | Lammens, Jr. | |
| 5,595,362 | A | 1/1997 | Rinderer et al. | |
| 5,736,674 | A | 4/1998 | Gretz | |
| 5,833,110 | A | 11/1998 | Chandler et al. | |
| 5,921,737 | A | 7/1999 | Ibey | |
| 5,931,325 | A | 8/1999 | Filipov | |
| 5,931,425 | A * | 8/1999 | Oliva | 248/200.1 |
| 5,959,246 | A | 9/1999 | Gretz | |
| 6,147,304 | A | 11/2000 | Doherty | |
| 6,204,447 | B1 | 3/2001 | Gretz | |
| 6,209,836 | B1 * | 4/2001 | Swanson | 248/300 |
| 6,307,154 | B1 | 10/2001 | Gretz | |
| 6,369,322 | B1 | 4/2002 | Gretz | |
| 6,384,334 | B1 * | 5/2002 | Webb | 174/58 |
| 6,533,225 | B1 | 3/2003 | Berges et al. | |
| 6,573,449 | B2 | 6/2003 | Vrame | |
| 6,576,837 | B1 | 6/2003 | Pimentel | |
| 6,590,155 | B2 * | 7/2003 | Vrame et al. | 174/50 |
| 6,666,419 | B1 * | 12/2003 | Vrame | 248/200.1 |
| 6,737,576 | B1 | 5/2004 | Dinh | |
| 6,749,162 | B2 | 6/2004 | Nicolides et al. | |
| 6,765,146 | B1 * | 7/2004 | Gerardo | 174/58 |
| 6,803,521 | B2 * | 10/2004 | Vrame | 174/58 |
| 6,820,760 | B2 | 11/2004 | Wegner et al. | |
| 6,870,101 | B1 | 3/2005 | Hull et al. | |
| 6,875,922 | B1 | 4/2005 | Petak et al. | |
| 6,956,172 | B2 | 10/2005 | Dinh | |
| 6,996,943 | B2 * | 2/2006 | Denier et al. | 52/220.7 |
| 7,036,782 | B2 * | 5/2006 | Cheatham et al. | 248/298.1 |
| 7,038,131 | B1 | 5/2006 | Gretz | |
| 7,053,300 | B2 * | 5/2006 | Denier et al. | 174/58 |
| 7,087,837 | B1 | 8/2006 | Gretz | |
| 7,151,218 | B2 | 12/2006 | Dinh | |
| 7,173,184 | B2 | 2/2007 | Hull et al. | |
| 7,189,928 | B2 | 3/2007 | Denier | |
| 7,214,876 | B1 | 5/2007 | Haberek et al. | |
| 7,259,328 | B1 | 8/2007 | Gretz | |
| 7,259,337 | B1 | 8/2007 | Gretz | |
| 7,273,982 | B1 | 9/2007 | Lalancette | |
| 7,276,661 | B2 | 10/2007 | Wegner et al. | |
| 7,300,025 | B2 | 11/2007 | Korcz | |
| 7,301,099 | B1 | 11/2007 | Korcz | |
| 7,306,482 | B1 | 12/2007 | Kidman | |
| 7,312,396 | B1 | 12/2007 | Gorman | |
| 7,410,072 | B2 | 8/2008 | Wegner et al. | |
| 7,439,443 | B2 | 10/2008 | Dinh | |
| 7,468,486 | B2 | 12/2008 | Yan | |
| 7,472,875 | B2 * | 1/2009 | Rinderer | H02G 3/125 220/3.3 |
| 7,495,170 | B2 | 2/2009 | Dinh et al. | |
| 7,521,631 | B2 * | 4/2009 | Dinh | 174/58 |
| 7,531,743 | B2 | 5/2009 | Johnson et al. | |
| 7,572,977 | B2 * | 8/2009 | Gorman | 174/58 |
| 7,637,385 | B2 | 12/2009 | Wegner et al. | |
| 7,645,936 | B2 | 1/2010 | Magno, Jr. | |
| 7,718,893 | B2 | 5/2010 | Purves et al. | |
| 7,757,875 | B2 | 7/2010 | Lalancette et al. | |
| RE41,661 | E | 9/2010 | Dinh | |
| 7,798,458 | B2 | 9/2010 | Borbolla et al. | |
| 7,935,886 | B2 | 5/2011 | Jafari | |
| 7,956,285 | B2 * | 6/2011 | Tally et al. | 174/58 |
| 8,168,887 | B2 | 5/2012 | Phillips | |
| 8,210,198 | B1 * | 7/2012 | Majocka | 137/360 |
| 8,424,827 | B2 * | 4/2013 | Dinh | 248/343 |
| 8,455,772 | B2 | 6/2013 | Phillips | |
| 8,598,454 | B2 | 12/2013 | Laughlin | |
| 9,040,848 | B2 | 5/2015 | Phillips | |
| 2005/0067546 | A1 * | 3/2005 | Dinh | 248/343 |
| 2008/0020632 | A1 | 1/2008 | Gorman | |
| 2008/0047729 | A1 | 2/2008 | Wegner et al. | |
| 2008/0053698 | A1 | 3/2008 | Purves et al. | |
| 2010/0084184 | A1 | 4/2010 | Phillips | |

OTHER PUBLICATIONS

Floor-Mount Box Support (FMBS1824) marketing brochure; © 2011 ERICO International Corporation. All rights reserved; retrieved from the Internet; <URL:http://www.erico.com/catalog/literature/F1080S-NAEN.pdf>.

* cited by examiner

ELECTRICAL BOX MOUNTING BRACKET WITH RAILS

BACKGROUND OF THE INVENTION

1. Field of the Invention

The invention is in the field of electrical box mounts.

2. Description of the Related Art

Electrical boxes are widely used to mount electrical components, such as switches and outlets, and to contain electrical wiring connections. Installation and alignment of such boxing can be a time-consuming process.

SUMMARY OF THE INVENTION

According to various aspects of the invention, an electrical installation bracket includes a body having rails on a back side of the body, the rails allowing an electrical box or other item to be placed at various locations along the body of the bracket. The bracket may include one or more of the following features: the body has a pair of legs that define an opening therebetween; the box protrudes through or is accessible through the opening; the rails are on the legs; the rails extend all the way along the opening; the rails extend only partway along the opening; the rails are bent portions of the body; the body telescopes to change its length; the legs have holes in them to allow mounting of the box; the holes are regularly spaced over at least part of the legs; the holes are regularly spaced over substantially all (an entire length) of the legs; the electrical box(es) is/are secured to the legs using fasteners (such as screws) that engage the holes; the legs have tabs in them that can be bent to help hold the box in place at certain locations relative to the legs; the legs have markings on them that aid in placing the box at a desired location; the bracket is a single piece of material; the bracket is multiple pieces of material; the bracket is made of metal or plastic, such as steel; the opening is a rectangular opening; the body has ears, with mounting holes for mounting the bracket to one or more studs (or other structure); the body has ears with mounting holes for mounting the bracket to the one or more studs (or other structure); one or more of the ears may include one or more tabs to aid in positioning the bracket relative to structure; the bracket has a bottom for installation in a vertical configuration; the bottom includes a bendable foot that may be deployed (bent) to stabilize the bracket, for example engaging a footer or resting on a floor; the bottom may include tabs that may be bent inward to engage a footer, and may have holes for receiving screws for mounting on a footer or other structure; the bracket may have a top; and/or the top may include an angled flange.

According to other aspects of the invention, a method of installing an electrical box may include installing the bracket having any combination of the features of the other paragraphs of this summary or the detailed description; engaging the electrical box in the rails of the bracket; and securing the box to the bracket.

According to a further aspect of the invention, an electrical installation bracket includes: a body having a front face and a back face on opposite sides; and rails on one of the faces; wherein the rails extend on opposite sides of an opening in the bracket; and wherein the rails are able to receive an electrical box that may be secured to the bracket at least one location along the bracket, when the electrical box is engaged with the rails.

According another aspect of the invention, an electrical installation bracket includes: a body having a front face and a back face on opposite sides; rails on the back face; wherein the rails extend on opposite sides of an opening in the bracket; and wherein the bracket has holes therein for securing an electrical box in place at multiple locations along the bracket.

According to yet another aspect of the invention, an electrical installation bracket includes: a body having a front face and a back face on opposite sides; rails on one of the faces; wherein the rails extend on opposite sides of an opening in the bracket; wherein the rails are folded-over parts of the body; wherein the bracket secures an electrical box in at least one location along the bracket; wherein the bracket includes a pair of bracket parts that together make up the body; wherein the bracket parts are in a telescoping relationship that allows the bracket to be selectively changed in length; wherein the body has legs on opposite sides of the opening; wherein the legs have with respective rows of the holes for securing the electrical box to the legs; and wherein the body is made of metal or plastic.

According to still another aspect of the invention, an electrical installation bracket includes: a body having a front face and a back face on opposite sides; rails on one of the faces; wherein the rails extend on opposite sides of an opening in the bracket; wherein the bracket secures an electrical box in at least one location along the bracket; wherein the body has legs on opposite sides of the opening; wherein the holes are in the legs; wherein the legs have tabs in them that facilitate positioning the electrical box within the opening; and wherein the bracket is a single-piece bracket made of a unitary, continuous single piece of metal or plastic.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The annexed drawings, which are not necessarily to scale, show various aspects of the invention.

DETAILED DESCRIPTION

Figure 1:
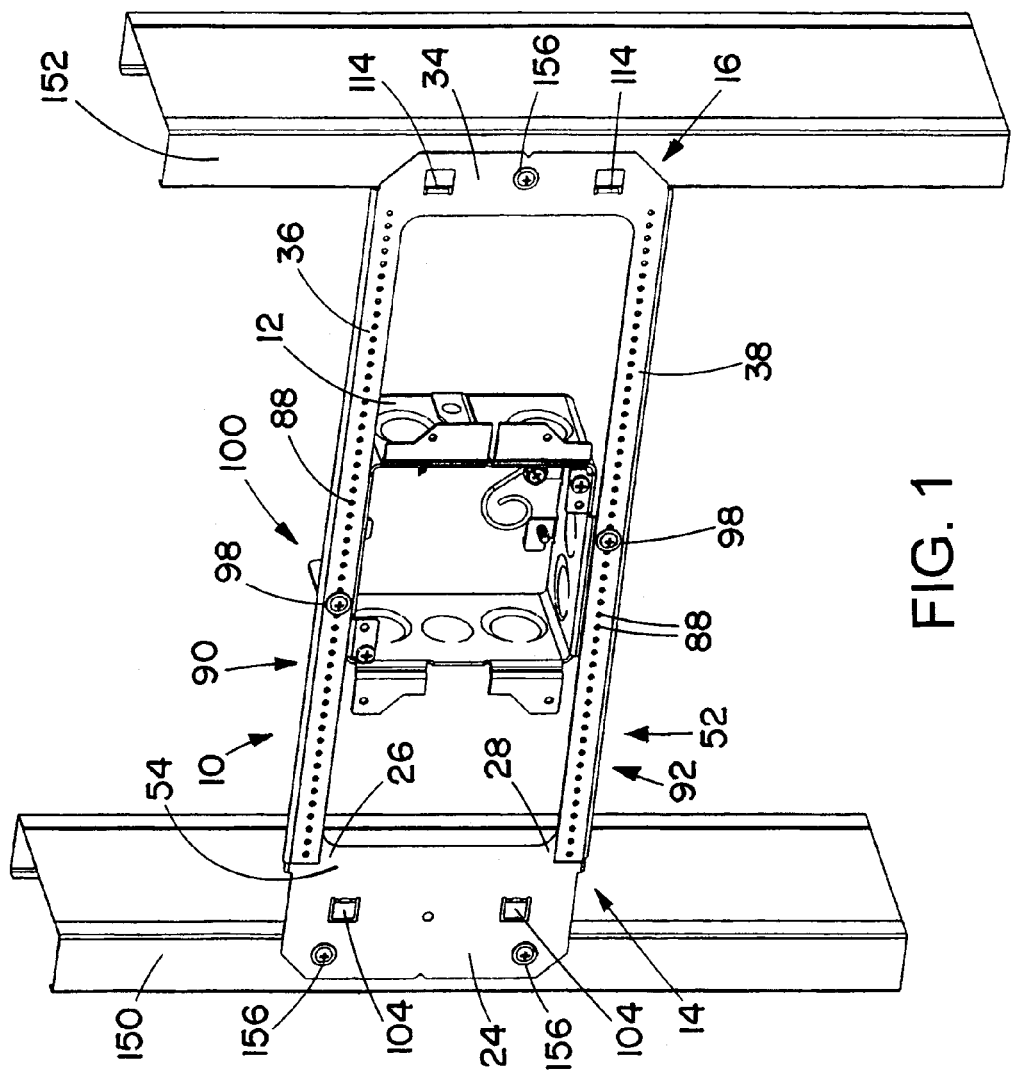
FIG. 1 is an oblique view of an electrical installation bracket in accordance with an embodiment of the invention, used for securing an electrical box to structure.

An electrical installation bracket includes a body that may telescope to allow the length of the bracket to be changed to accommodate installation in different configurations, for example to accommodate different spacing between mounting studs. The bracket has rails on a face that allow an electrical box to be positioned, by sliding, at any of a variety of locations along the length of the body. The body has holes in it for securing the box to the bracket at a desired location along the body, with a front of the box for example protruding through an opening in the body. The body includes ears on opposite sides of the opening, with mounting holes for mounting the bracket to studs or other structure (or other hardware or devices). The electrical installation bracket advantageously provides more flexibility in placement of electrical boxes, with pre-prepared holes available for securing boxes in any of a variety of locations.

FIGS. 1-4 show an adjustable electrical installation bracket 10 used for mounting any of a variety of electrical boxes 12. The bracket 10 has a pair of bracket parts 14 and 16 that are in a telescoping arrangement, with the parts 14 and 16 fitting together and able to slide relative to each other in order to change the length of the bracket 10. The bracket part 14 includes an ear 24, and a pair of legs 26 and 28 that extend parallel to one another from one end of the ear 24. The bracket part 16 similarly includes an ear 34, and a pair of legs 36 and 38 extending parallel to one another from an end of the ear 34. The legs 26 and 28 have respective rails 40 and 42 on a back face 44 of the bracket part 14, and the legs 36 and 38 have respective rails 46 and 48 on a back face 50 of the bracket part 15. When the bracket parts 14 and 16 are mechanically coupled together, the rails 40 and 42 nest in the rails 46 and 48, maintaining mechanical connection between the bracket parts 14 and 16.

The legs 26, 28, 36, and 38 together constitute a body 52 of the bracket 10, with the body 52 having a front face 54 and a back face 56. The rails 40, 42, 46, and 48 are on the back face 56 of the body 52. Alternatively, the rails 40, 42, 46, and 48 may be on the front face 54.

Figure 2:
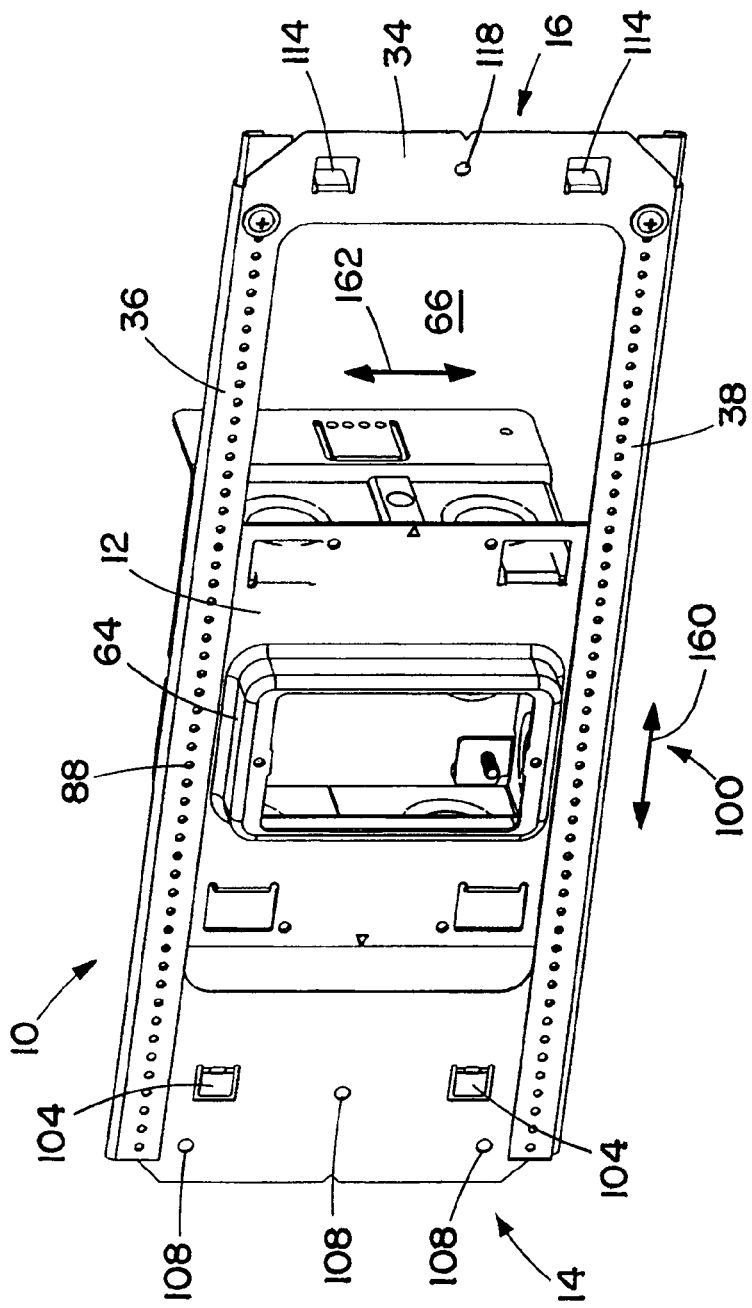
FIG. 2 is an oblique view of the electrical installation bracket of FIG. 1, and an electrical box coupled to the bracket, in accordance with another embodiment of the invention.

The rails 40, 42, 46, and 48 receive flange tabs of the electrical box 12. Referring to FIG. 2, with the flange tabs within the rails 40, 42, 46, and 48 allow a front part 64 of the electrical box 12, such as an attached mud ring, to protrude through an opening 66 of the bracket 10. The opening 66 is defined by and bordered by the ears 24 and 34, in combination with the legs 26, 28, 36, and 38. So situated, the electrical box 12 is able to change position relative to the bracket 10 without being disengaged from the bracket 10. This advantageously facilitates fine adjustment of the position of the electrical box 12.

Figure 3:
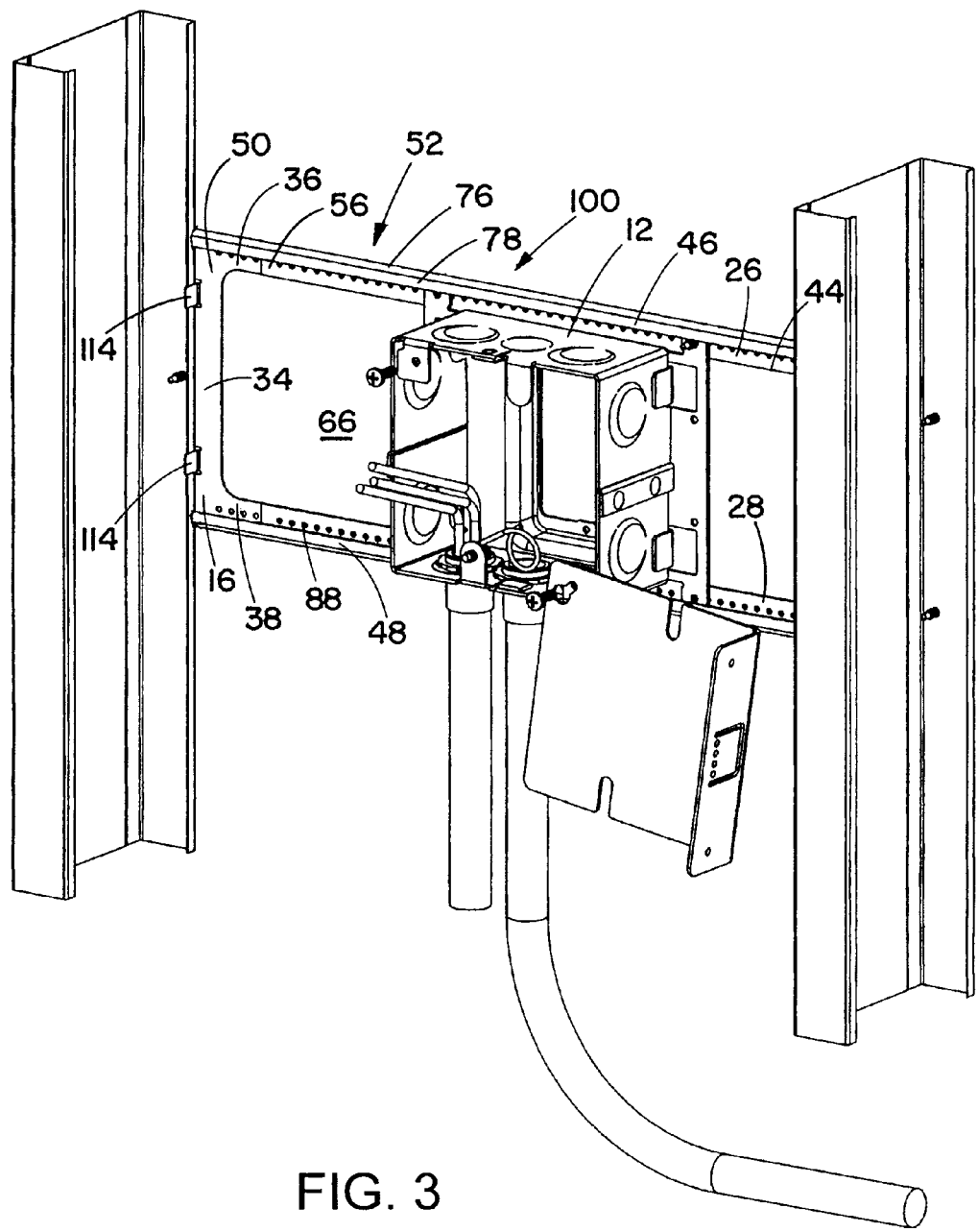
FIG. 3 is an oblique view of another electrical box installation using the electrical installation bracket of FIG. 1.
Figure 4:
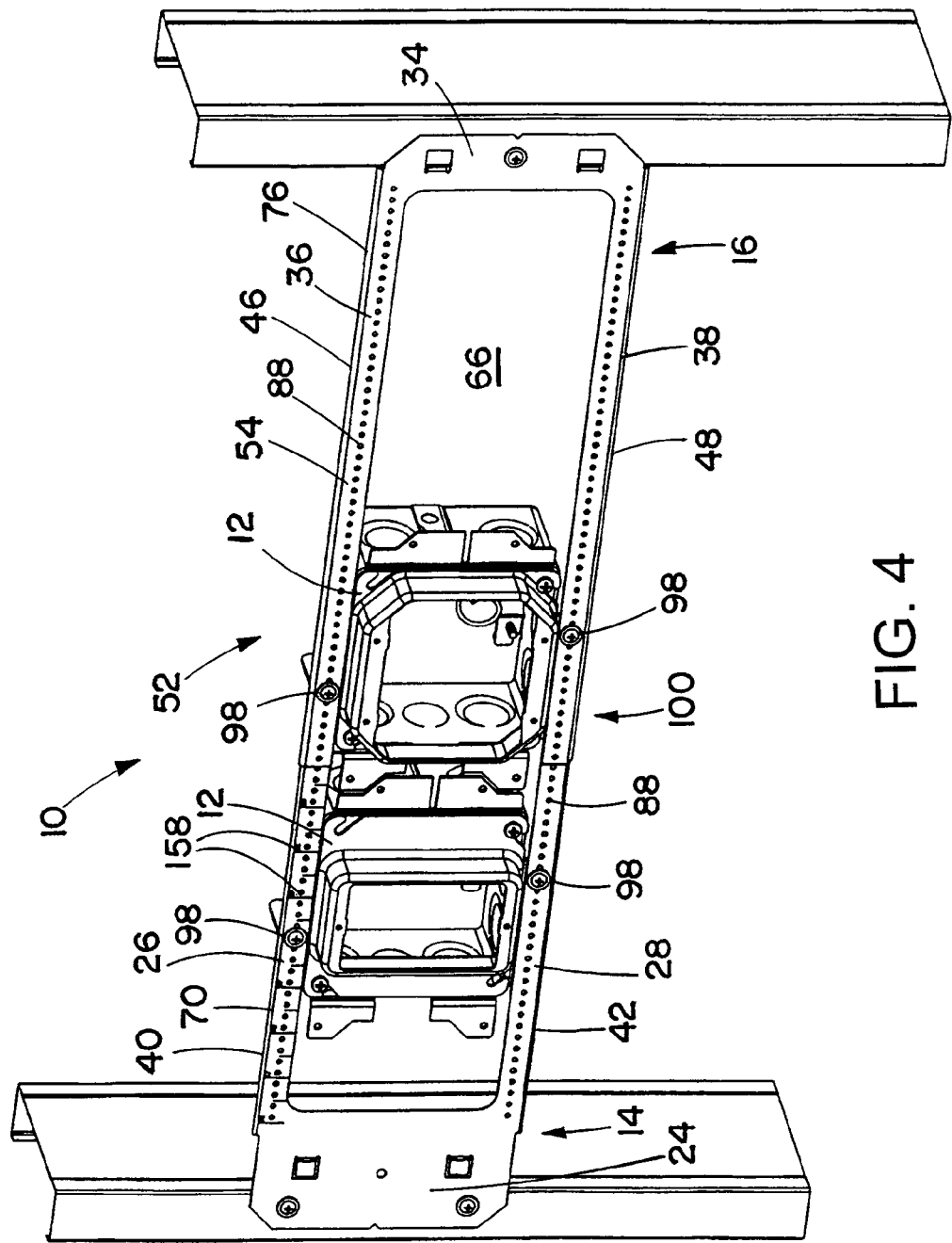
FIG. 4 is an oblique view of still another electrical box installation using the electrical installation bracket of FIG. 1.

In the illustrated embodiments various types of electrical boxes 12 are mounted in the bracket 10. The bracket 10 may be used for mounting a single electrical box 12, for example as shown in FIGS. 1-3, or may be used for mounting multiple electrical boxes 12, as shown in FIG. 4.

The rails 40, 42, 46, and 48 are fold-over extensions of the legs 26, 28, 36, and 38. The rails 40, 42, 46, and 48 may be folded in any of a variety of ways. In one embodiment the rails 40, 42, 46, and 48 are curled around, as shown in FIG. 3 for the rails 40 and 46. The rails 40 and 46 have respective curved portions 70 and 76 that connect them to the legs 26 and 36. The curved portions 70 and 76 end in respective flat extensions, such as the flat extension 78 shown in FIG. 3, that may be substantially parallel to the back faces 44 and 50. The curvature of the curved portions 70 and 76 may be different, with the curved portion 70 have a smaller radius of curvature than the curved portion 76, to allow the rail 40 to fit into and engage the rail 46. As an alternative, the rails 40, 42, 46, and 48 may be folded at angles to the back faces 44 and 50, for example being folded at approximately a 45 degree angle to the back faces 44 and 50.

The legs 26, 28, 36, and 38 have series of holes 88 running along their lengths, spaced apart in the directions away from the ears 24 and 34. When the bracket parts 14 and 16 are fitted together, the holes 88 form two sets of holes on opposite sides of the opening 66, along the length of the bracket 10. A top set 90 of the holes 88 is at the top of the bracket 10, constituting the holes 88 in the legs 26 and 36. A bottom set 92 of the holes 88 is at the bottom of the bracket 10, constituting the holes 88 in the legs 28 and 38. The sets 90 and 92 run parallel to each other, with the holes 88 spaced so that adjacent holes are an even predetermined distance from each other, with adjacent of the holes 88 about 3.2 mm (0.125 inches) apart, for example.

The holes 88 are used for receiving screws, such as the screws 98, for securing the electrical box 12 to the bracket 10. The holes 88 may be positioned on the legs 26, 28, 36, and 38 such that the screws 98 are able to be engaged with the holes 88 without coming into contact with the extensions of the rails 40, 42, 46, and 48. In an overlap section 100 of the bracket 10, where the legs 26 and 36 overlap, and where the legs 28 and 38 overlap, the brackets 14 and 16 may be adjusted relative to one another such that the holes 88 of the bracket parts 14 and 16 align. The screws 98 may be sheet metal screws that have threads that cut to some extent into the portions that surround that holes 88 that they are screwed into, allowing the screws 98 to remain fixed in place without use of additional hardware, such as nuts. Similarly, the screws 98 may cut into holes in the flange tabs of the electrical box 12. The holes in the flange tabs may be substantially the same size as the holes 88, or may be a different size. The screws 98 may also be used for securing the bracket parts 14 and 16 together in a desired configuration, such as at a desired length. As many screws 98 may be used as necessary. As an alternative to the screws 98, other sorts of threaded fasteners may be used for a similar purpose. The screws 98 may come preinstalled in some of the holes 88, for example in holes 88 at one or both ends of the hole sets 90 and 92, which holes are unlikely to be used for mounting the electrical box 12.

The ears 24 and 34 have features to aid in mounting the bracket 10 to studs, other structure, or other devices or objects. The ear 24 has a pair of tabs 104 that can be bent down by an end user to engage a side surface of a stud or other object. The ear 24 also has a number of mounting holes 108, for receiving suitable fasteners, such as screws, for securing the bracket 10 to a stud or other object. One of the holes 108 is between the bendable tabs 104, and the other holes 108 are located further from the opening 66, near outer corners of the ear 24.

The ear 34 has a pair of tabs 114 that are bent down, protruding from the back face 50 of the bracket part 16, that facilitate positioning of the bracket 10 by pushing the tabs 114 against a stud or other object. The tabs 114 may be bent as part of the manufacturing process. Alternatively the tabs 114 may be configured to be bent by the end user, for example by hand or using a hand tool, such as a screwdriver. The ear 34 also has a mounting hole 118 for receiving a fastener, such as a threaded fastener like a sheet metal screw, for securing the ear 34 to a stud or other object.

With reference in particular to FIG. 1, the bracket 10 and the electrical box 12 may be installed as follows. First, with the bracket parts 14 and 16 already coupled together, the electrical box 12 is engaged with the rails 40, 42, 46, and 48. The bracket 10 may then be placed between a pair of studs 150 and 152. The tabs 114 on the ear 34 may be bent down and pressed against a side surface of the stud 152, with the bracket part 14 then extended relative to the bracket part 16 so that at least part of the ear 24 overlies the stud 150. The ears 24 and 34 may then be connected to the studs 150 and 152 using suitable fasteners, such as sheet metal screws 156.

The electrical box 12 may then be positioned as desired between the studs 150 and 152, without a need to hold the electrical bracket 10 in place during the positioning. The close spacing of the holes 88 allows a large number of possible positions of the electrical box 12 between the studs 150 and 152. This is an advantage in installations where precise placement of the electrical box 12 may be required. For instance, in hospitals it may be required that boxes for some equipment be positioned to an accuracy of 3.2 mm (0.125 inches). Once the box 12 is positioned where desired, the screws 98 (or other fasteners) may be used to secure the box 12 to the bracket 10.

As shown in FIG. 4, some or all of the legs 26, 28, 36, and 38 may have markings 158 on them, such as etched lines, to facilitate positioning of one or more of the electrical boxes in desired positions. The markings 158 may be spaced apart from one another by a set distance, for example being spaced apart by 6.4 mm (0.25 inches).

In the illustrated embodiment of FIG. 2, the box 12 has a mud ring 64 that is part of the box 12. This arrangement makes for an assembly that has a minimum of parts that need to be manipulated. For example the installation does not require a separate mud ring that is placed on a front side of a bracket, and is secured to a box on the back side of the bracket, with the bracket sandwiched between the box and the mud ring. Details regarding the box 12 shown in FIG. 2 may be found in commonly-owned U.S. patent application Ser. No. 13/347,033, "Backless Electrical Box and Method of Making," filed Jan. 10, 2012, and incorporated by reference in its entirety. The box 12 shown in FIG. 2 has different distances between its flange tabs in one direction 160, than in an orthogonal direction 162. The first flange tab spacing in the direction 160 is configured for use with the bracket 10, while the other flange tab spacing in the direction 162 is for use with an alternate embodiment bracket that is described further below.

The box 12 alternatively may have any of a variety of other suitable configurations that allow it to engage the bracket 10 for mounting. Although there are advantages to using a backless box with a built-in mud ring, arrangements with a separate mud ring may be used instead.

The bracket 10 may be made of any of a variety of suitable materials, for example sheet steel, another metal, or plastic. Suitable fabrication steps, such as stamping, cutting, and bending, may be used to manufacture the bracket 10.

The bracket 10 may be used to install the box 12 in a ceiling, between ceiling beams. The bracket 10 may be used in any of a variety of other situations or configurations, especially where the length of the bracket 10 (the dimension from the ear 24 to the ear 34) is in a primarily horizontal direction.

Figure 5:
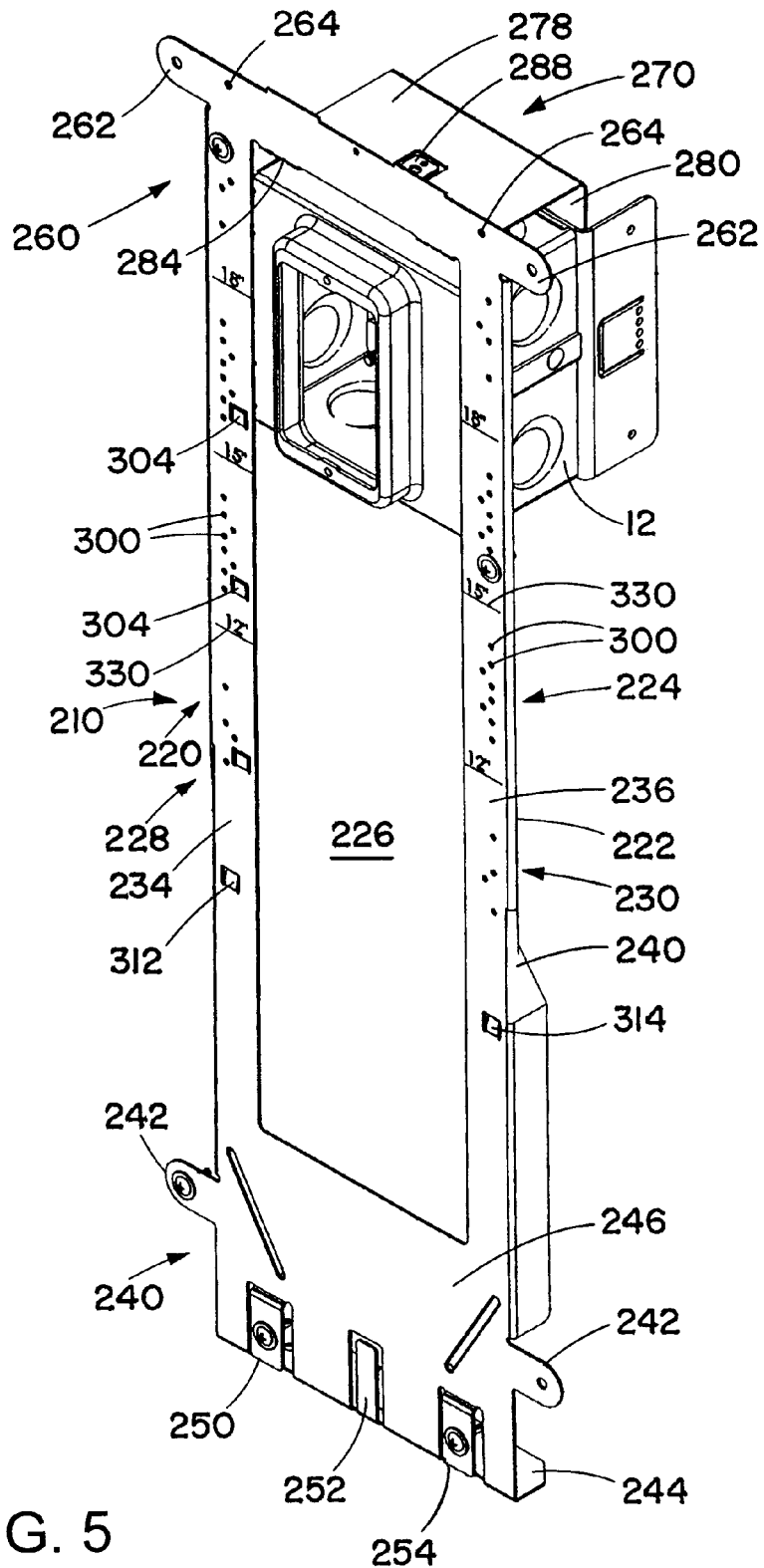
FIG. 5 is an oblique view of an electrical installation bracket in accordance with an alternate embodiment of the invention.
Figure 6:
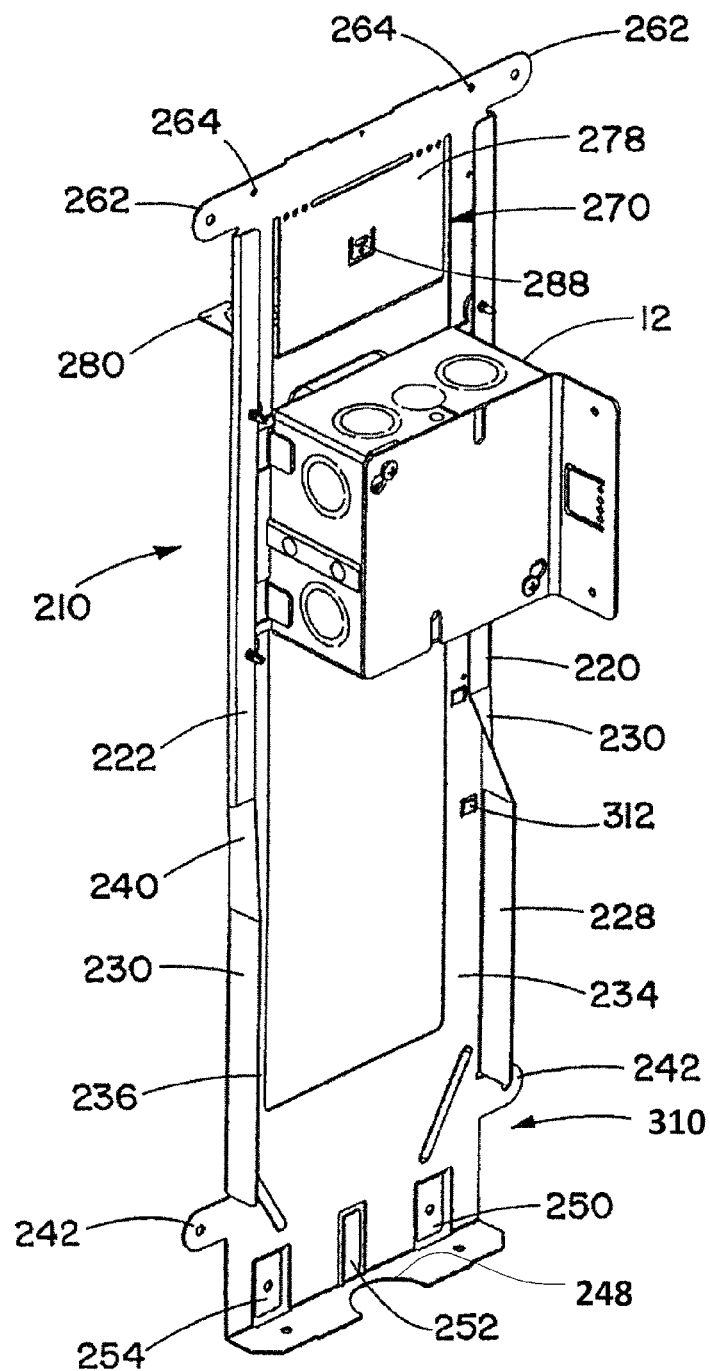
FIG. 6 is another oblique view of the electrical installation bracket of FIG. 5.

FIGS. 5 and 6 show an alternate embodiment bracket 210 that is used for mounting the electrical box 12, with the bracket 210 oriented vertically. The bracket 210 has rails 220 and 222 on its back face 224. The rails 220 and 222 run parallel to one another, on opposite sides of a central opening 226. The rails 220 and 222 are inward-bent portions of flanges 228 and 230 of legs 234 and 236 that flank the opening 226, with the rails 220 and 222 on opposite sides of the opening 226. Curved portions 238 and 240 are between the rails 220 and 222, and the rest of the flanges 228 and 230. The curved portions 238 and 240 provide a smooth transition to the rails 220 and 222, and also aid in facilitating engagement of the flange tabs of the electrical box 12 with the rails 220 and 222.

The electrical box 12 may be engaged with the bracket 210 by sliding the flange tabs of the box 12 into engagement with the rails 220 and 222. The flange tabs with the spacing 162 are used for engaging the rails 220 and 222. Thus the rails 220 and 222 have a different spacing than the rails 40, 42, 46, and 48 (FIG. 4) of the bracket 10 (FIG. 1). In the illustrated embodiment the rails 220 and 222 are spaced further apart than the rails 40, 42, 46, and 48.

Figure 7:
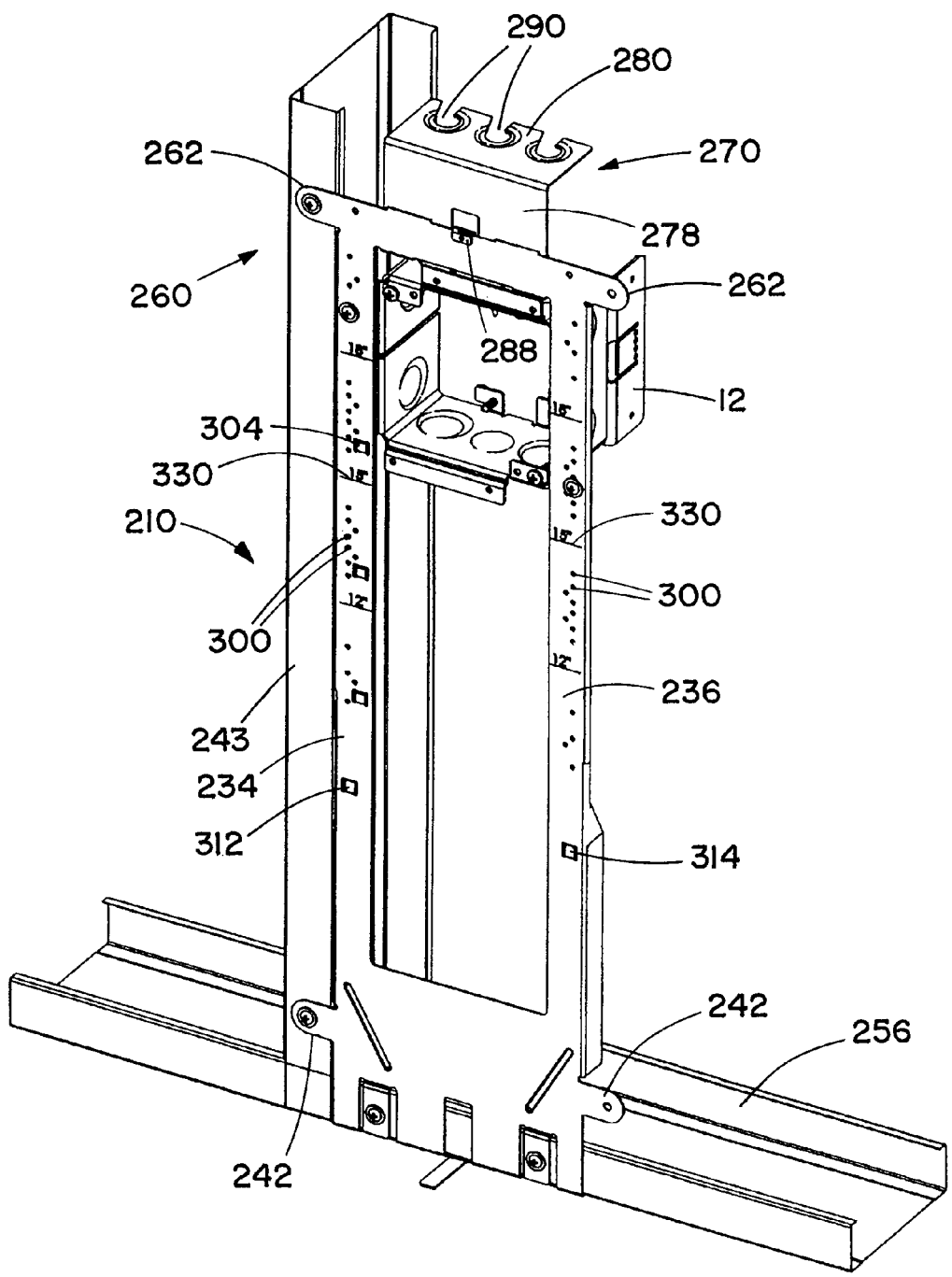
FIG. 7 is an oblique view of an installation using the electrical installation bracket of FIG. 5.

The bracket 210 has a bottom 310 with a number of features used for mounting and stabilizing the bracket 210. A pair of bottom flange tabs 242 are on opposite sides of the bottom 310, and may be used for securing the bracket 210 to a channel or bracket 243, as shown in FIG. 7. The bottom 310 also has a bottom edge flange 244 that is bent at an angle relative to a body 246 of the bracket 210, toward the back face 224 of the bracket 210. For example the bottom edge flange 244 may be at a right angle to the body 246. The bottom edge flange 244 may have a rounded cutout 248 (FIG. 6) for letting wires, cables, conduits, tubing, or other runs, pass through the bottom edge flange 244.

The bottom 310 also has a series of bendable tabs 250, 252, and 254. The side tabs 250 and 254 may be bent inward, toward the back face 224, in the same direction as the bottom edge flange 244. The side tabs 250 and 254 also may be used to engage the bottom of structure, such as a footer 256 (FIG. 7), and may have holes in them, used to receive fasteners, such as sheet metal screws, for securing the tabs 250 and 254 to structure such as the footer 256. The middle tab 252 may be folded down in the opposite direction, away from the bottom edge flange 244, and in the direction of a front face 258 of the bracket 210. The folded-down middle tab 252 acts as a foot to help provide stability to the bracket 210.

The bracket 210 has a top 260 that also has a series of features for mounting. The top 260 has a pair of top flange tabs 262 on opposite sides of the top 260. The top flange tabs 262 may be used for securing the bracket 210 to structure or another object, for example using fasteners such as sheet metal screws to secure the bracket 210 to the channel 243, as shown in FIG. 7. Other fastener holes 264 may be used for receiving various types of fasteners, such as screws or nails.

A top flange 270 may be initially located in the opening 226 that is bordered on either side by legs 234 and 236. The top flange 270 may be an angled flange, having a pair of parts 278 and 280 that are at right angles to each other. The proximal flange part 278, which is bendable connected to a bottom edge 284 of the top 260, may have a bendable tab 288. The distal flange part 280 may have a series of openings 290, configured to receive and clamp various sizes of runs of conduit, for example. Various sized punch-out portions may surround parts of the openings, with removal of one or more of the parts increasing the size of the openings 290, allowing the openings 290 to be configured by an end user to receive different sizes of conduits, or other objects. The tab 288 may be located so that it can operate to secure the top flange 270 to the rest of the top 260, as shown in FIG. 7.

Alternatively the top flange 270 may be bent as shown in FIG. 5. In this configuration the distal flange part 280 is used to support the back of the electrical box 12.

The legs 234 and 236 each have various holes 300, for securing the electrical box 12 when the box 12 is engaged with the rails 220 and 222. Screws, such as sheet metal screws, may be screwed into the holes 300 and/or holes in the box's flange tabs, to hold the electrical box 12 (or multiple electrical boxes) in place relative to the bracket 210. The leg 234 also has a series of bendable tabs 304 that may be bent down to hold one or more boxes in place, for example to position the box(es) temporarily before they are permanently secured using fasteners in the holes 300. The legs 234 and 236 include respective locking tabs 312 and 314, at a location just below the bottom of the rails 220 and 222. The locking tabs 312 and 314 may be bent downward by an end user to prevent the electrical box(es) 12 from sliding down and disengaging from the rails 220 and 222.

The legs 234 and 236 may have markings 330 on them. The markings 330 may be etched lines, and may indicate where electrical boxes or other equipment are to be positioned in order to have the boxes at specified heights above the footer 256 (or the floor).

Figure 8:
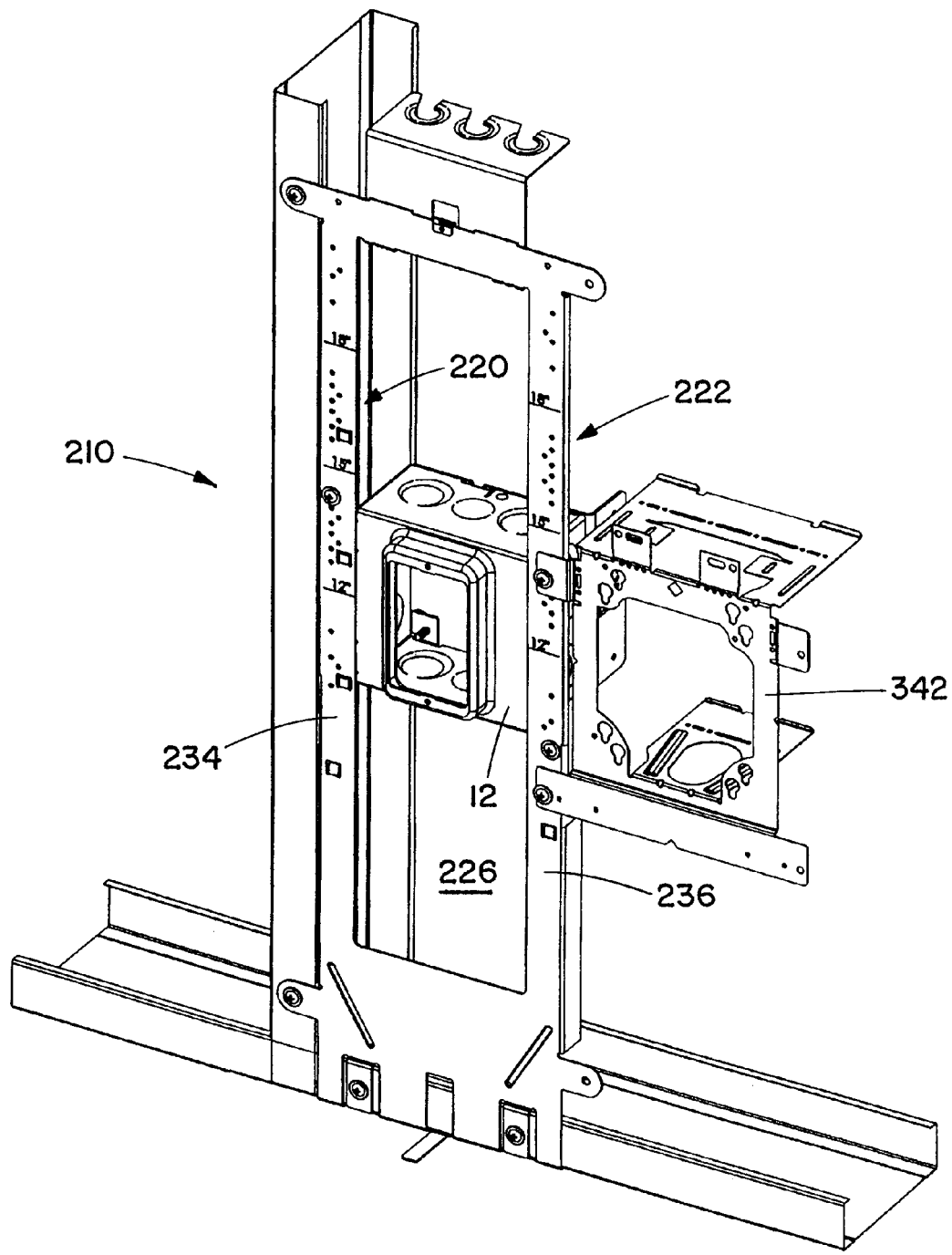
FIG. 8 is an oblique view showing another installation using the electrical installation bracket of FIG. 5.

FIG. 8 shows an alternate installation for using the bracket 210. One electrical box 12 is engaged with the rails 220 and 222, and is located in the central opening between the legs 234 and 236. The other box 342 is outside of the central opening 226, attached to the leg 236. The bracket 210 thus may be used to secure the boxes 12 and 342 in a side-by-side configuration.

Figure 9:
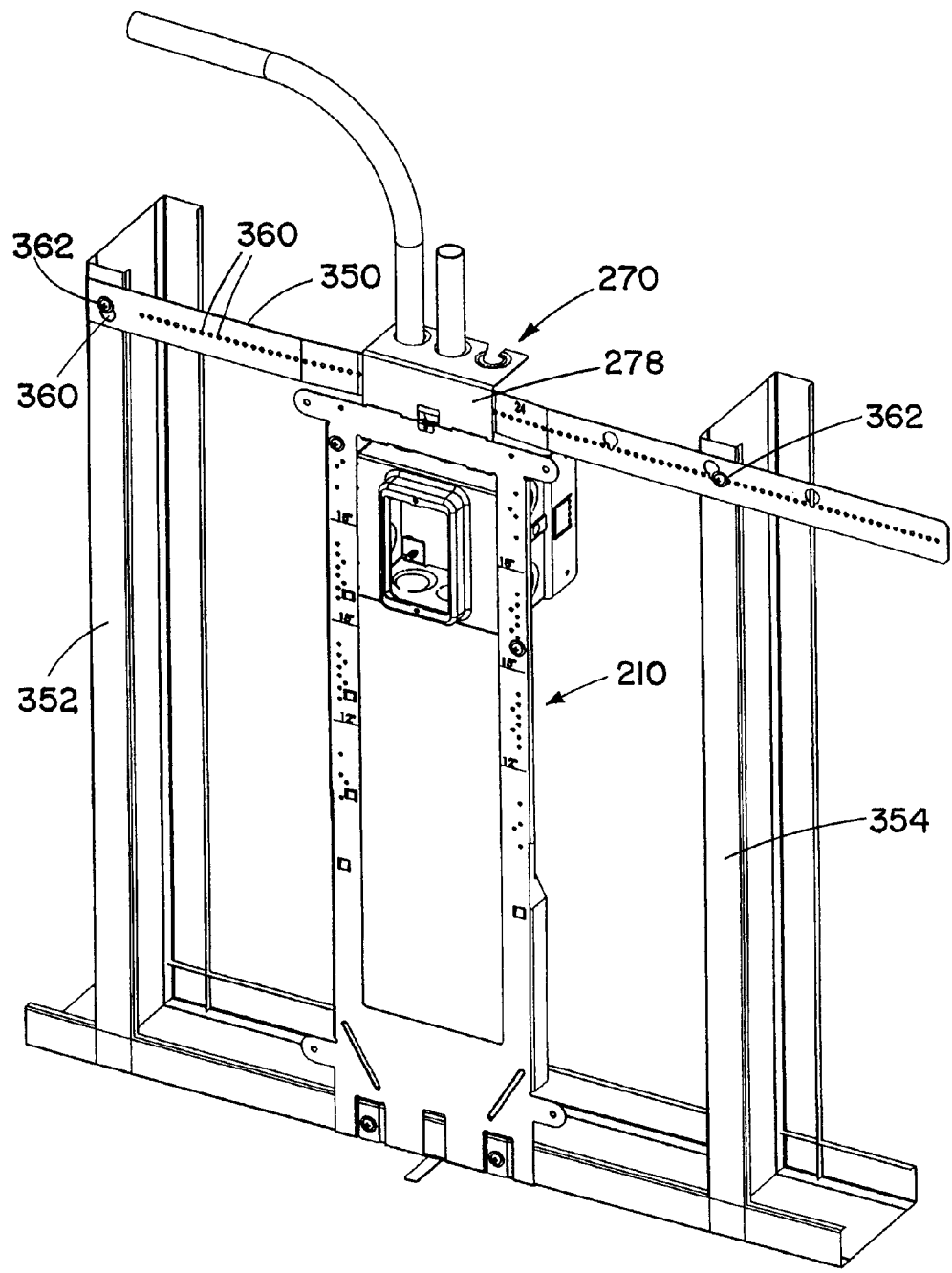
FIG. 9 is an oblique view showing still another installation using the electrical installation bracket of FIG. 5.

FIG. 9 shows another installation using the bracket 210. A strip 350 runs between a pair of vertical channels or studs 352 and 354. The strip 350 supports the top of bracket 210 by running behind the flange 270. Specifically the strip 350 runs behind and supports the proximal flange part 278. The strip 350 may be attached to the proximal flange part 278. The strip 350 has holes 360 in it, for receiving fasteners such as mounting screws 362 for securing the strip 350 to the channels or studs 352 and 354.

As noted above, the brackets 10 and 210 have many advantages over prior devices for mounting electrical boxes. The brackets 10 and 210 allow flexibility and accuracy in mounting any of a variety of electrical boxes in any of a variety of positions or configurations. Installations with the brackets 10 and 210 may also be performed efficiently, saving time in installation processes, and allowing installation with a minimum of separate parts to be manipulated.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electrical installation bracket for securing an electrical box in a cavity between a first structure and a second structure, the electrical box including a first mounting part and a second mounting part, the electrical installation bracket comprising:
   a first bracket part including:
      a first ear for securing the first bracket part to the first structure;
      a first leg extending from the first ear and including a first rail; and
      a second leg extending from the first ear and including a second rail;
   a second bracket part including:
      a second ear for securing the second bracket part to the second structure;
      a third leg extending from the second ear and including a third rail; and
      a fourth leg extending from the second ear and including a fourth rail;
   the third rail being nested with the first rail to form a first telescoping portion with a first length, the first length being changeable to correspond to a length of the cavity by sliding the third rail relative to the first rail;
   the fourth rail being nested with the second rail to form a second telescoping portion with a second length, the second length being changeable to correspond to the length of the cavity by sliding the fourth rail relative to the second rail;
   the first telescoping portion, the second telescoping portion, the first ear and the second ear at least partly defining a mounting opening with a length;
   the first mounting part of the electrical box being received in and slidable within the first telescoping portion and the second mounting part of the electrical box being received in and slidable within the second telescoping portion to secure the electrical box to the electrical installation bracket, without fasteners, at any position of a continuous range of positions that extend over the length of the mounting opening.

2. The electrical installation bracket of claim 1, further comprising:
   a first series of holes spaced along the first leg;
   a second series of holes spaced along the second leg;
   a third series of holes is spaced along the third leg; and
   a fourth series of holes is spaced along the fourth leg;
   wherein adjacent holes of each of the first series of holes, the second series of holes, the third series of holes, and the fourth series of holes are spaced apart from each other by a predetermined distance.

3. The electrical installation bracket of claim 2, wherein the predetermined distance is approximately 0.125 inches.

4. The electrical installation bracket of claim 2, wherein the first series of holes, the second series of holes, the third series of holes, and the fourth series of holes are configured to receive fasteners to permanently secure the electrical box to the electrical installation bracket.

5. The electrical installation bracket of claim 1, wherein the first mounting part of the electrical box is received in and slidable within the first telescoping portion and the second mounting part of the electrical box is received in and slidable within the second telescoping portion to temporarily secure the electrical box to the electrical installation bracket, without fasteners, at any position of a continuous range of positions that extend over the length of the mounting opening.

6. The electrical installation bracket of claim 1, wherein at least one of the first bracket part and the second bracket part is formed as a single monolithic piece of material.

7. The electrical installation bracket of claim 1, wherein the first rail includes a first curved portion with a first radius of curvature, the second rail includes a second curved portion with a second radius of curvature, the third rail includes a third curved portion with a third radius of curvature smaller than the first radius of curvature, and the fourth rail includes a fourth curved portion with a fourth radius of curvature smaller than the second radius of curvature.

8. The electrical installation bracket of claim 1, wherein the first rail is folded at a first angle relative to the first leg, the second rail is folded at a second angle relative to the second leg, the third rail is folded at a third angle relative to the third leg, and the fourth rail is folded at a fourth angle relative to the fourth leg.

9. The electrical installation bracket of claim 8, wherein each of the first angle, the second angle, the third angle, and the fourth angle is approximately 45 degrees.

10. The electrical installation bracket of claim 1, wherein the first mounting part of the electrical box includes a first flange disposed at a front of the electrical box, and the second mounting part of the electrical box includes a second flange disposed at the front of the electrical box.

11. An electrical installation bracket for receiving an electrical box, the electrical box including a first mounting part and a second mounting part, the electrical installation bracket comprising:
　a body with an opening;
　a first rail on a first side of the opening, the first rail being configured to slidably receive the first mounting part of the electrical box;
　a second rail on the second side of the opening, the second rail being configured to slidably receive the second mounting part of the electrical box;
　a first flange on the first side of the opening;
　a second flange on the second side of the opening;
　a first curved portion tapering to connect the first flange to the first rail; and
　a second curved portion tapering to connect the second flange to the second rail;
　when the electrical box is moved along the body between the first flange and the second flange, the first curved portion guiding the first mounting part of the electrical box into the first rail and the second curved portion guiding the second mounting part of the electrical box into the second rail.

12. The electrical installation bracket of claim 11, wherein the first rail and the second rail extend along a first face of the body; and
　wherein the first flange and the second flange are substantially perpendicular to the first face.

13. The electrical installation bracket of claim 11, wherein the first rail, the first flange, and the first curved portion are included in a unitary first extension of the body; and
　wherein the second rail, the second flange, and the second curved portion are included in a unitary second extension of the body.

14. The electrical installation bracket of claim 11, further comprising:
　a first tab on the body on the first side of the opening, the first tab being bendable from a first orientation that permits movement of the electrical box past the first tab to a second orientation that blocks movement of the electrical box past the first tab; and
　a second tab on the body on the second side of the opening, the second tab being bendable from a third orientation that permits movement of the electrical box past the second tab to a fourth orientation that blocks movement of the electrical box past the first tab;
　wherein, with the first mounting part of the electrical box disposed within the first rail and the second mounting part of the electrical box disposed within the second rail, bending the first tab to the second orientation and the second tab to the fourth orientation secures the first mounting part of the electrical box within the first rail and the second mounting part of the electrical box within the second rail, without fasteners.

15. The electrical installation bracket of claim 14, wherein the first tab is aligned with at least one of the first flange and the first curved portion; and
　wherein the second tab is aligned with at least one of the second flange and the second curved portion.

16. The electrical installation bracket of claim 14, further comprising:
　a plurality of third tabs on the body on the first side of the opening, the plurality third tabs being disposed at intervals along the first rail and at least one of the plurality of third tabs being bendable from a fifth orientation that permits movement of the electrical box past the at least one of the third tabs to a sixth orientation that blocks movement of the electrical box past the at least one of the plurality of third tabs;
　wherein, with the first mounting part of the electrical box disposed within the first rail and the second mounting part of the electrical box disposed within the second rail, bending the at least one of the plurality of third tabs to the sixth orientation secures the first mounting part of the electrical box within the first rail and the second mounting part of the electrical box within the second rail, without fasteners.

17. The electrical installation bracket of claim 16, further comprising:
　an angled flange including:
　　a first flange part that is secured to the body at one end of the opening; and
　　a second flange part that extends at an angle to the first flange part and includes a plurality of openings for receiving a plurality of conduit runs;
　wherein, when in a seventh orientation, the angled flange is at least partly disposed in the opening and the second flange part extends to a first side of the body; and
　wherein the angled flange is bendable, at a connection between the first flange part and the body, to an eighth orientation in which the angled flange is outside of the opening and the second flange part extends to a second side of the body.

18. The electrical installation bracket of claim 11, wherein the first mounting part of the electrical box includes a first flange disposed at a front of the electrical box, and the second mounting part of the electrical box includes a second flange disposed at the front of the electrical box.

19. An electrical installation bracket for receiving an electrical box, the electrical box including a first mounting part and a second mounting part, the electrical installation bracket comprising:
　a body with an opening;
　a first rail on a first side of the opening, the first rail being configured to slidably receive the first mounting part of the electrical box;
　a second rail on the second side of the opening, the second rail being configured to slidably receive the second mounting part of the electrical box; and
　an angled flange including:
　　a first flange part that is secured to the body at one end of the opening; and
　　a second flange part that extends at an angle to the first flange part and includes a plurality of openings for receiving a plurality of conduit runs;
　wherein, when in a first orientation, the angled flange is at least partly disposed in the opening and the second flange part is disposed on an opposite side of the body from the first rail and the second rail; and wherein the angled flange is bendable, at a connection between the first flange part and the body, to a second orientation in which the angled flange is outside of the opening and the second flange part is disposed on a same side of the body as the first rail and the second rail.

20. The electrical installation bracket of claim 19, wherein a tab is disposed on the first flange part of the angled flange, the tab being bendable to secure the first flange part to the body when the angled flange is bent to the second orientation.

21. The electrical installation bracket of claim 19, wherein, with the angled flange bent to the second orientation, with the first mounting part of the electrical box received in the first rail, and with the second mounting part of the electrical box received in the second rail, the second flange part extends above the electrical box to guide the plurality of conduit runs to the electrical box.

22. The electrical installation bracket of claim 19, wherein, with the angled flange bent to the second orientation, with the first mounting part of the electrical box received in the first rail, and with the second mounting part of the electrical box received in the second rail, the second flange part supports a back side of the electrical box.

\* \* \* \* \*